United States Patent [19]

Lapeyre

[11] Patent Number: 5,067,103

[45] Date of Patent: Nov. 19, 1991

[54] HAND HELD COMPUTERS WITH ALPHA KEYSTROKE

[75] Inventor: James M. Lapeyre, New Orleans, La.

[73] Assignee: The Laitram Corporation, New Orleans, La.

[21] Appl. No.: 590,325

[22] Filed: Sep. 28, 1990

Related U.S. Application Data

[63] Continuation of Ser. No. 248,127, Sep. 23, 1988, abandoned, which is a continuation-in-part of Ser. No. 60,225, Jun. 10, 1987, Pat. No. 5,008,847, which is a continuation-in-part of Ser. No. 844,872, Mar. 27, 1986, abandoned, which is a continuation-in-part of Ser. No. 729,559, May 2, 1985, abandoned, which is a continuation-in-part of Ser. No. 459,998, Jan. 21, 1983, Pat. No. 4,547,860.

[51] Int. Cl.$^5$ .............................................. G06F 3/023
[52] U.S. Cl. ............................ 364/709.16; 364/709.15
[58] Field of Search ....................... 364/707.16, 709.15, 364/710.07, 710.14; 341/22, 23

[56] References Cited

U.S. PATENT DOCUMENTS

| | | | |
|---|---|---|---|
| 3,675,513 | 7/1972 | Flanagan et al. | 364/709.16 |
| 3,967,273 | 6/1976 | Knowlton | 364/709.16 |
| 4,385,291 | 5/1983 | Piguet | 364/709.15 |
| 4,481,508 | 11/1984 | Kamei et al. | 364/709.15 |
| 4,718,029 | 1/1988 | Morino et al. | 364/709.16 |

OTHER PUBLICATIONS

Claver et al., "Computer-Assisted Word Entry Process" IBM Tech. Disclosure Bulletin vol. 21 No. 10 Mar. 1979 p. 4184.

Primary Examiner—David H. Malzahn
Attorney, Agent, or Firm—Laurence R. Brown; James T. Cronvich

[57] ABSTRACT

Particularly in hand held alphameric keyboard actuated computers, available room dictates a need to limit the number of keys without sacrificing computer performance. Further, for portable computers reference to an instruction manual is not feasible. Thus usefulness critically depends upon integrated operating instructions. Formerly there is neither room or facilities for instructions, nor room on the keyboard for enough keys. Herein, a computer keyboard of a few keys controlled by a computer multi-mode processing system to have a plurality of roles permits a very large number of computer functions to be entered and controlled. Further in combination with these roles, a computer organized temporary display panel displays keystroke selection indicia for the different keyboard operating roles. This expands instructional notation otherwise possible on the keys and adjacent keyboard locations. Thus, an entire set of alphabetic characters may be entered and processed in the computer by means of as few as six keys in an alpha mode operating the keys in a two stroke per character entry mode. Accordingly, the display panel is programmed by the computer to show with instructional indicia, typically a multiple-choice menu, the role for at least a subcombination of the keys in the current operating role of the keys in effect at the time. This permits detailed keystroke instructions to be available for performing hundreds of operations for which modern computers are capable.

18 Claims, 8 Drawing Sheets

HAND HELD COMPUTERS WITH ALPHA KEYSTROKE

This application is a continuation of U.S. Ser. No. 07/248,127, filed Sept. 23, 1988, now abandoned, which is a continuation-in-part of U.S. Ser. No. 07/060,225 filed June 10, 1987, now U.S. Pat. No. 5,008,847, Apr. 16, 1991, which is a continuation-in-part of U.S. Ser. No. 06/844,872 filed Mar. 27, 1986, now abandoned, which is a continuation-in-part of U.S. Ser. No. 06/729,559 filed May 2, 1985, now abandoned, which is a continuation-in-part of U.S. Ser. No. 06/459,998 filed Jan. 21, 1983, now U.S. Pat. No. 4,547,860.

TECHNICAL FIELD

This invention relates to hand held manual keyboard controlled portable alphameric computers having few keys operable in a multiple stroke per entry mode to produce many different input entries of data and commands wherein the keys have different roles in a plurality of computer operating modes. More particularly it relates to computer organized instructions displayed on a computer controlled temporary display panel for identifying currently available keystrokes to enter specific data and commands from the keys as the role of the keys change.

BACKGROUND ART

It has been known to change the role of keys on a keyboard to produce more entries from fewer keys. For example U.S. Pat. No. 4,007,443 issued Feb. 8, 1977 to M. A. Bromberg et al. uses a set of twenty keys in four different modes selected by keys depressed by fingers on a hand holding a portable computer keyboard to produce alphameric input data. A similar technique is disclosed in U.S. Pat. No. 3,892,958 issued July 1, 1975 to C. C. Tung wherein two prefix or shift keys change the keyboard role to provide three times as many input possibilities from a set of keys in a portable computer. In U.S. Pat. No. 3,187,321 issued June 1, 1965 to S. L. Kameny, keyboard overlays with accompanying switching structure switch in different key operation modes and provide instructions to the operator showing what key operating modes are in use as different overlays are plugged in.

It has also been known that the number of keys on a keyboard for entry of alphabetic characters could be reduced to as few as seven keys by requiring two keystrokes per entry. This is disclosed in British Specification 1,417,849 published Dec. 17, 1975 and in U.S. Pat. No. 3,967,273 issued June 29, 1976 to K. C. Knowlton.

There are unsolved problems however created in systems having the keys so reduced on the keyboard. Thus with changing of key roles from time to time and the necessity to stroke keys in a particular sequence to select an entry, errors in operation are apt to occur because it is not always evident what the role of a particular key is. Furthermore, with modern computers, and particularly those operable in the alpha mode, there are so many entry choices available that it is difficult to memorize all the options that might be required for a particular use. This problem is even more acute in operation of portable hand held computers, where in general there is no access to an operating manual at the point of use. On hand held computers there is little room for visually accessible operating instructions for hundreds of input entry choices available from the keyboard.

Furthermore, the art has been deficient in defining with unmistakable visual indicia instructions the sequential keystroke choices when multiple keystroke sequences are required for an entry. The aforesaid Knowlton U.S. Pat. No. 3,967,273 thus is ambiguous in identifying a keystroke sequence and requires complex mental choices in making sequential keystroke selections that are apt to cause error. Furthermore Knowlton is incapable of providing keychoice instructions for any changes in the key roles that cause different operations from any of the keys. Also it is difficult to view the indicia on a keyface or the keyboard or adjacent thereto when it is in use, and this slows down the selection process when the indicia are not fully memorized.

Accordingly it is a general objective of this invention to provide improved instructional indicia for entry of many different input commands and data characters, including full alphabet sets including punctuation, in the space available in hand held computers, and operable in computers that require a sequence of keystrokes per entry and that change the role of the keys on the keyboard.

Further objects, features and advantages are to be found throughout the following description, drawings and claims.

DISCLOSURE OF THE INVENTION

In this invention a preferred computer embodiment is a portable hand held multi-function alphameric computer with a multi-line capability temporary visible display screen, typically LCD, presenting computer organized data. The computer is manually operable in an alphameric mode from as few as twelve keys on the keyboard. To permit a wide range of data and function entries from the keyboard, the keys are operated in different roles in different computer operating modes to give a wider range of selections from a few keys for entering alphameric characters and computer instruction commands. In one operating mode, keystroke entries are made in a multiple-stroke sequence of at least two keystrokes for an entry. Thus, for example, with a two-stroke-per-entry mode of keyboard operation 144 choices are available from twelve keys. That permits the entry of a full set of alphabetic characters, decimal digits and punctuation, usually requiring about fifty keys in a typewriter keyboard, and further permits nearly a hundred additional computer commands with only the two-stroke sequence of twelve keys. The 144 selections are further multiplied by assigning different roles to the keys in different computer operating modes.

It is a critical unresolved problem to eliminate ambiguity of the key function in the different roles and to fully clarify the sequence of strokes and choice of keys for any desired entry without memorization or reference to a computer instruction manual. Accordingly the computer is programmed to organize data representative of the keyboard roles and presents keystroke instructions on a temporary display screen with a multiple line capability to provide room for corresponding data indicia along with keystroke instruction indicia. Thus, multi-choice keystroke instruction menus are dynamically displayed as the modes and stroke sequencing of the computer take place. This produces current unambiguous instructions for such entries as the choice of alphabetic characters from a subset of the twelve keyboard keys for example. The display screen is divided into separate regions for the instruction indicia and data, when the instructions are visible, and the instructions need only be displayed when necessary to provide full access to the multiple line display for other purposes.

Thus, when the system is changing modes, or is operable in a multiple stroke per entry mode, the computer organized instructions are dynamically changed and displayed on the screen in accordance with the computer requirements to give available options for the next keystroke. The instruction format for some of the indicia is in the form of a multiple-choice menu of keystroke choices available, and this may take the form of a keyboard array presentation on the temporary display screen that changes or disappears when the next keystroke choice is made.

BRIEF DESCRIPTION OF THE DRAWINGS

In the drawings, like reference characters represent comparable features throughout the various views to facilitate comparison. Primed reference characters show variations of the basic features.

THE PREFERRED EMBODIMENTS

Figure 1:
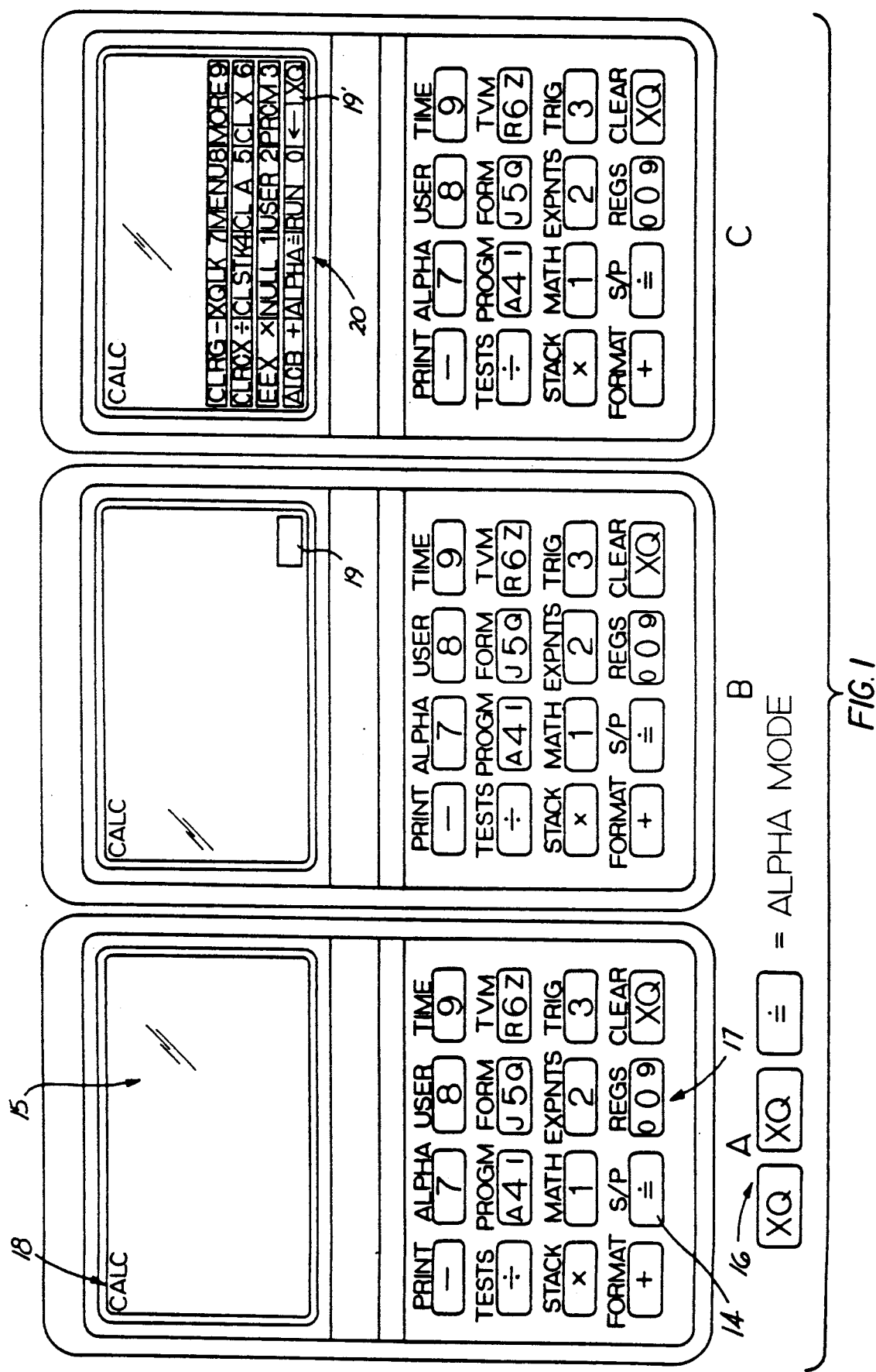
FIG. 1 is a plan view sketch for one keyboard layout embodiment of the invention illustrating a sequence of computer keyboard-display faces showing entry of keystroke instruction indicia for a sequence of keystrokes establishing the alpha mode of computer operation available from the sixteen keys.

With reference to FIG. 1, the display shows the status of the computer organized temporary display screen 15 during the three successive strokes 16 of individual keys, which establish the alpha mode. Reference is made to the foregoing patent background art for the general operation and computer organization for the two-stroke-per-entry mode from a few keys. This computer status in the default mode is illustrated in FIG. 1A. This is a decimal calculation mode with one stroke per key entry as indicated on the CALC entry 18 portion of the display screen 15, which shows the current operating mode. The keystroke sequence 16 changes the operation mode from a calculating mode (CALC) shown on the screen to an alpha mode where the entire alphabet may be reproduced from the sixteen keyboard keys of this embodiment. Operation of the computer in the two-stroke-per-entry mode to make available alphabetic characters and commands with the limited number of keys is shown in the parent case above identified as U.S. Pat. No. 4,547,860.

This keyboard embodiment 17 of sixteen keys has notation thereon for some of the keyroles. The primary legends comprise the ten decimal digits 0 to 9, the four algebraic functions for subtract, add, multiply and add, a decimal point or equal key and an execute control key (XQ). Other legends identify generally other modes or subprograms available. The choices of alphabetic characters in the respective ranges a to i, j to q, and r to z, are shown by the indicia on the 4, 5 and 6 keys. Thus all alphabetic characters in this embodiment are initiated from three home keys readily fingered with three fingers on one hand.

In this system the default mode of operation is the calculate mode, identified by a corresponding computer organized subsystem to display the "calc" notation 18, until replaced by another mode selected by keyboard entered instructions such as those 16 for the "alpha" mode. Several modes are thus available with the feature that in each mode the role of the keys is changed, thereby creating a larger number of selections from the sixteen keys than available simply in the two-stroke-per-entry mode. Thus, note that in the "calc" mode the keys "0" to "9" function as single-stroke-per-entry keys to enter decimal digits, whereas, in the "alpha" mode the keyboard functions in the two-stroke-per-entry mode to produce over two hundred selections from the set of sixteen keys. With several such "two stroke" modes of operation the two hundred selections are further multiplied.

Figure 7:
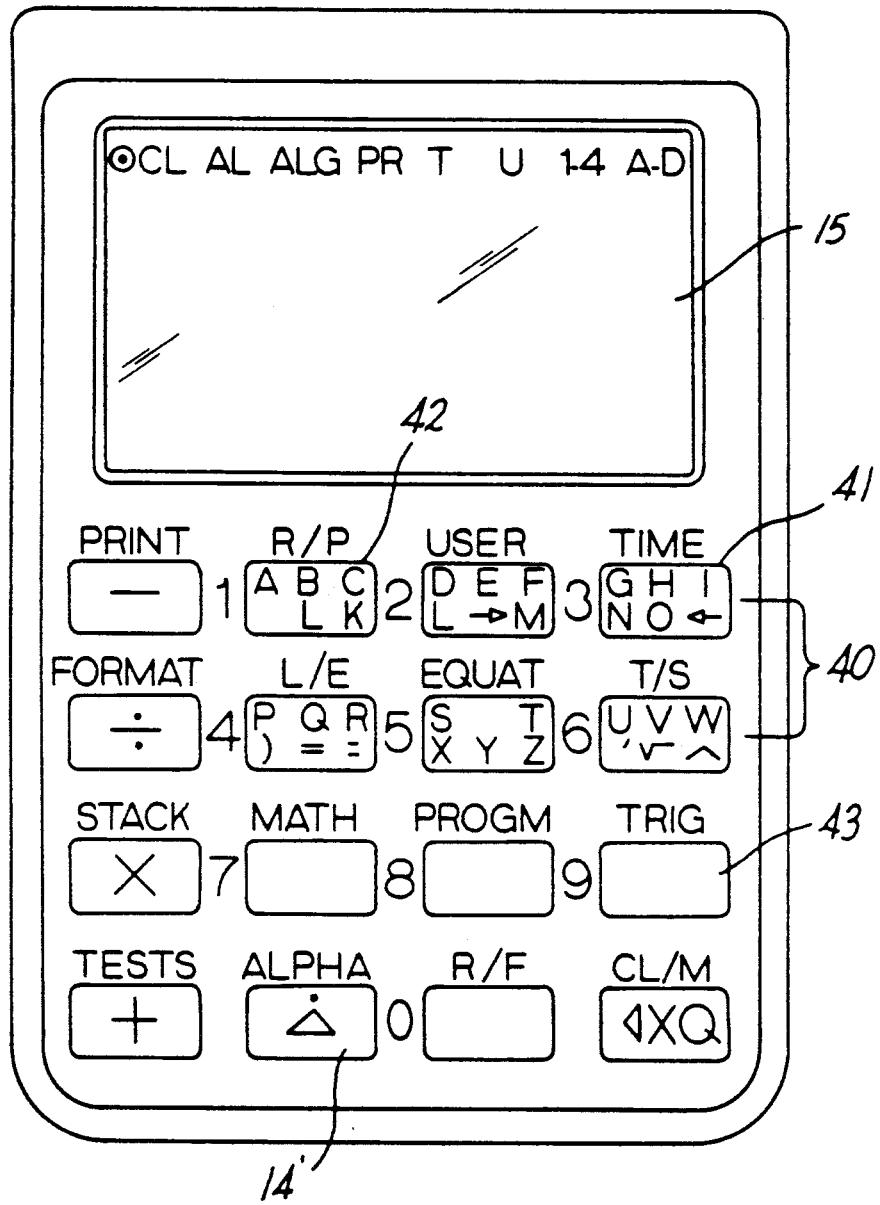
FIG. 7 is a keyboard-display panel plan view of an embodiment of the invention using only six keys for selection of a set of 36 alpha characters and symbols.

The leftmost computer keyface view A represents the default calculating mode condition when the computer is turned on. This is a numeric mode with the keyboard operating in a one-stroke-per-entry mode as a conventional calculator. Thus it is convenient to have the algebraic function keys for plus, minus, multiply and divide as shown on the key notation for the leftmost column of keys. In this mode the period-equal key 14 serves the dual role of entering decimal points with the first stroke in an algebraic number, and entering the numerical number word with the second stroke, as set forth in my U.S. Pat. No. 4,680,725 issued July 14, 1987. The equals notation shows that the computer works in the conventional arithmetic sequence. In the embodiment of FIG. 7 however the arrowhead notation indicates an "enter" function for operation in the reverse Polish notation mode. To leave the "calc" default single stroke mode and establish a different role for the keyboard keys the XQ (execute) key is stroked once. This puts the computer into a two-stroke-per-entry mode where the next two strokes defines one of the multiple modes available, such as "alpha".

Thus, the center keyface view B represents the computer condition after the first stroke of the XQ key. The previous keystroke (XQ) causes the computer to generate the indicia legend block 19, which may be four dots, for example. This indicates that the computer is in the two-stroke-per-entry mode and awaiting the next two strokes to select a particular operating mode. The legend 18 indicates the calculating mode in the interim until a different mode is established. Now with the entry of a further XQ keystroke, the menu display 20, in the right hand view C, signifying the mode choices available displays in the box 19' the XQ legend to identify the previous stroke. The multiple-choice menu chart 20 is displayed in a region of the multi-line capability screen 15 required for operation in accordance with this invention. The region 20 is set aside for keystroking instruction indicia automatically with the second XQ stroke, unless the display is toggled off by operator choice.

As one choice on the mode choice menu 20, it should be clear that the equal key chooses the alpha mode. Other key notations follow the mode definition indicia, such as "more" or "PRGM" for the program mode. Note that the chart is a representation of the keyboard geographic layout together with a name indicia of the individual keys and the function that the individual keys will perform. Also note that the computer organizes the display information in response to each keystroke, when applicable such as in a multiple stroke per entry mode, to provide indicia instructions for the current operating conditions and for the next keystroke. Thus, there is no need for an operator to remember two or three sequential keystroking operations from the instruction indicia, but only to perform one keystroke at a time from explicit instructions shown at the time that that keystroke is activated for the function illustrated by the indicia.

Figure 2:
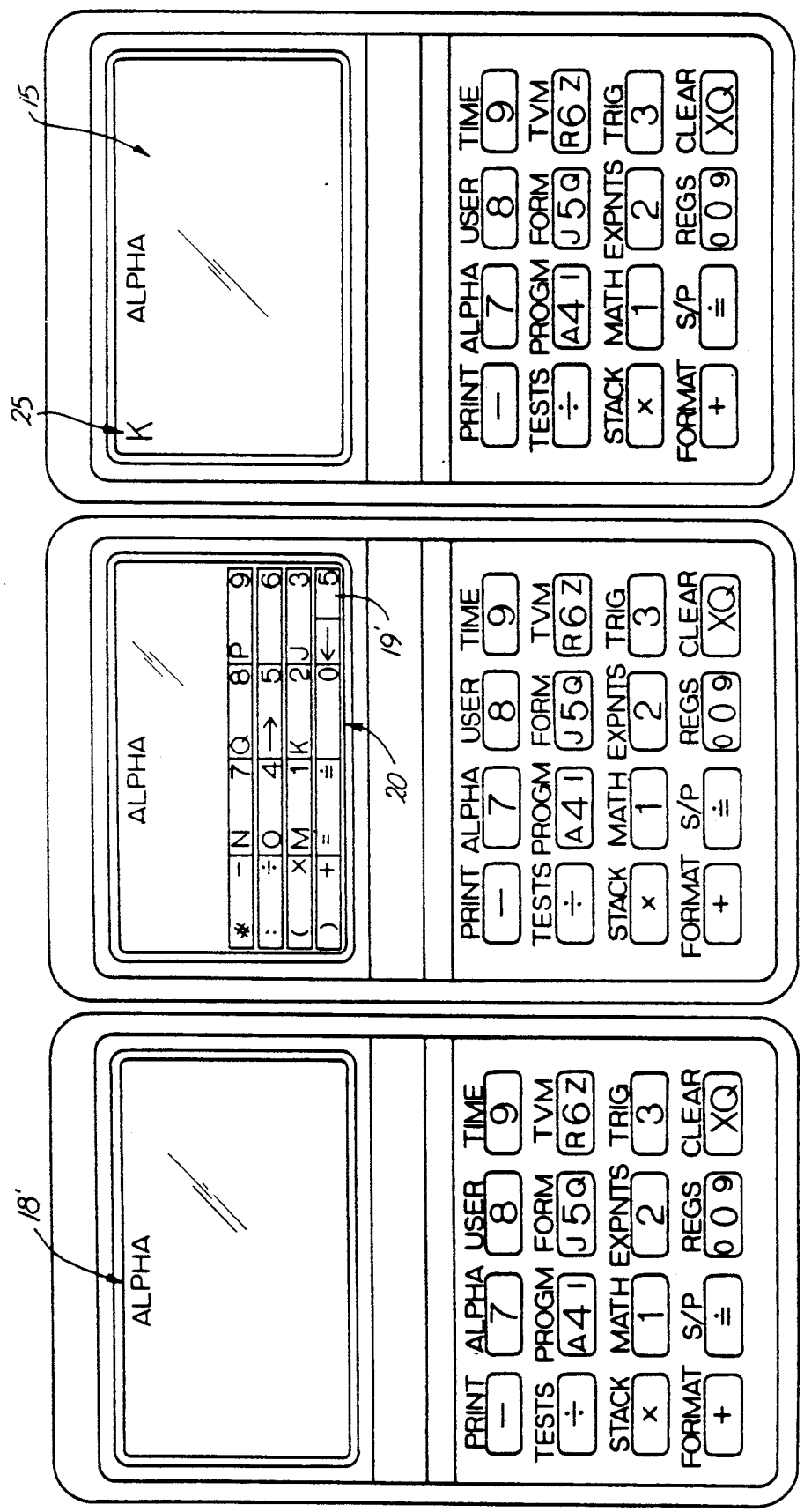
FIG. 2 is a similar sketch showing the sequence of displays and keystrokes for selection of the alphabetic character "k" in the two-stroke-per-entry alpha mode making available the entry of all alphabetic characters from the few available keys, with a first stroke from a row of only three keys.

When the alpha mode is established by the three stroke key sequence, the computer is operable in the manner shown in FIG. 2. The alpha mode (18') is a two stroke per entry mode giving essentially 256 choices from the sixteen keys. The choice of alphabetic characters only will be illustrated, but it should be clear that corresponding program routines, etc. can be chosen from other keystroke-sequence combinations available if desired.

The sequence of computer status is similarly illustrated here in views A, B and C for the three status conditions in the process of entering two keystrokes 16' for the selection of an alphabetic character from an alphabetic set of twenty-six characters, in this case significantly exceeding the number of keys. The computer is in the "alpha" mode as shown by the mode identification indicia 18' in all three status conditions and until the computer is shifted out of the alpha mode by the toggle selection process starting with an XQ stroke and followed by an equal-decimal key stroke.

For selection of the letter "k", the "5" key in FIG. 2A is chosen from the first order menu on the keyface for the first stroke. This first keystroke is recorded at 19' in FIG. 2B as the selection menu 20' is automatically presented on the display panel. Note that this is one of a maximum of fifteen such menus for the appropriate keystroke choices for the second stroke, depending upon the first stroke key selected. The entire alphabet set of twenty-six characters with corresponding punctuation, etc., is spread over three such menus by selection of any of the three keys 4, 5 or 6. On menu 20' therefore is displayed among other choices of punctuation symbols, etc., the expected alphabetic characters between "J" and "Q" (shown on keyface 5), each identifying the second stroke key activated to enter that character into the computer. Accordingly to select "K" the "2" key is stroked (16'). This results in the entry of "K" into the computer as shown in the data region of the display screen at 21. Further alpha characters may be chosen in the same way by successive two stroke sequences for any desired message or data to be entered. Note that the instruction indicia screen region 15 is cleared automatically for use as a data display when not in use for displaying the next keystroke entry choice from an appropriate menu. Accordingly the entire screen is available for data display for any such functions as data processing, word processing, or memory retrieval.

Figure 3:
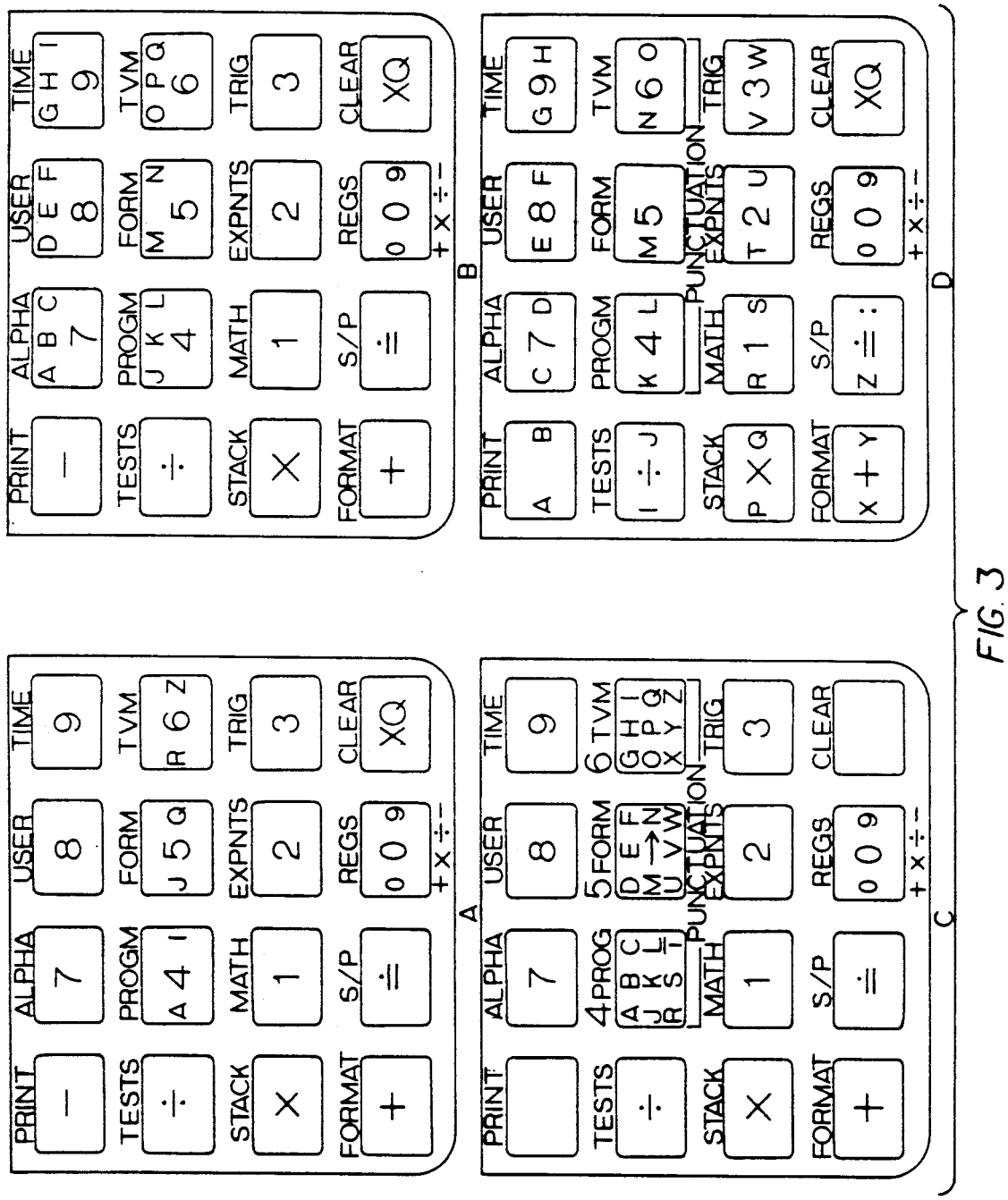
FIG. 3 is a comparative plan view of a set of four alternative keyboard layouts for providing entry of all the alphabetic characters (26) from the set of twelve keys.

The role of the keys on the keyboard may be programmed by subroutines stored in the computer in the various modes. Thus, the keyboard may have different optional configurations for the alphabet selected by conventional computer programming techniques. Thus keyboard role configurations such as shown in the views A, B, C and D of FIG. 3 may be established for selection of the alphabetic characters. The keyboard and keyface indicia in each of these views indicate the first stroke key selection for any specific character of the English alphabet.

In a preferred keyboard configuration, the two strokes for the most often used characters should be arranged for an easier entry. For example, in FIG. 3C the vowels A, E, and I could be entered by two strokes of the same keys, respectively, 4, 5 and 6 to increase entry speed possibilities at least after the alphabet is memorized. The home key position of three fingers for all alpha character entries is also advantageous. Also, an option of toggling the indicia displays off and on may be included as a command step so that those experienced in typing the alphabet can use the entire screen as a data display for such purposes as word processing and the like without interruption of the displayed data with keystroke instructions.

Figure 4:
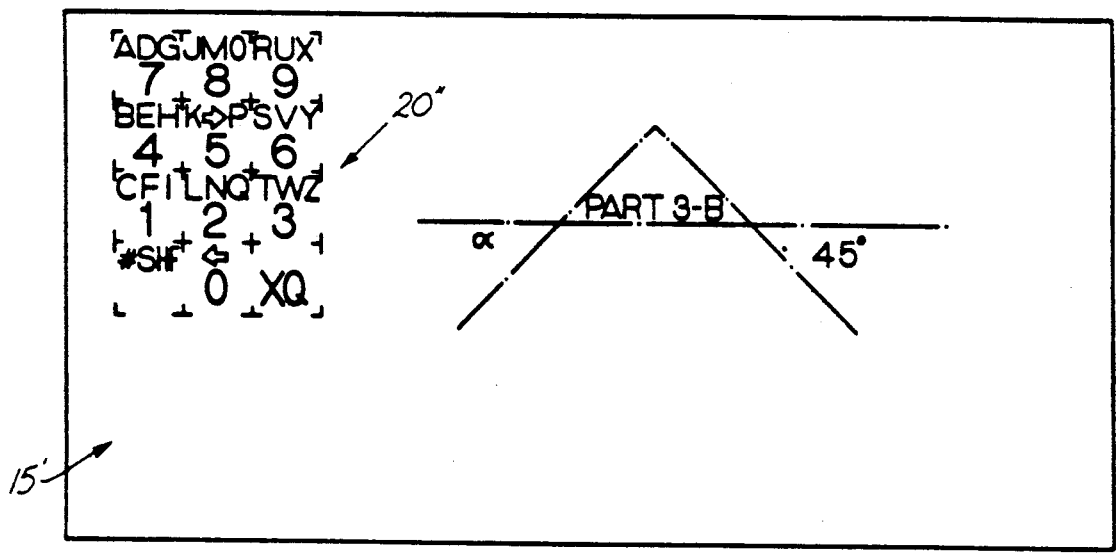
FIG. 4 is an alternative display panel organization sketch for presenting instructions for alphameric operation of a twelve key keyboard.

A different keyboard stroke instruction configuration is shown in FIG. 4. In this keyboard reproduction on the temporary display screen 15, the basic twelve keys are configured for two stroke alpha selection by the secondary notation above the primary key function of numeric decimal digit entry displaying the second keystroke choice. This keyboard is well adapted to alphanumeric entry of data where numerical digits are entered by a single stroke and alpha characters are entered by two successive strokes, as programmed by the XQ key to change from alpha to decimal keyboard roles. Note that an advantage of the keyboard configuration on the temporary display panel as produced by the computer by internal programming and display easily configured by those skilled in the art, is that the fingers do not hide the indicia while the keys are being used. This can be termed a "virtual" keyboard which is useful with those types of computers that can be programmed by touching the screen, or by directing a cursor to a screen location for selection of an entry. In this embodiment, this keyboard layout 20" on the display screen 15' is a representation of the key array layout on the keyboard for facilitating entry of alphameric data, and shows which keys are to be manually stroked for the currently available decimal digit and alphabetic character entries.

Figure 5:
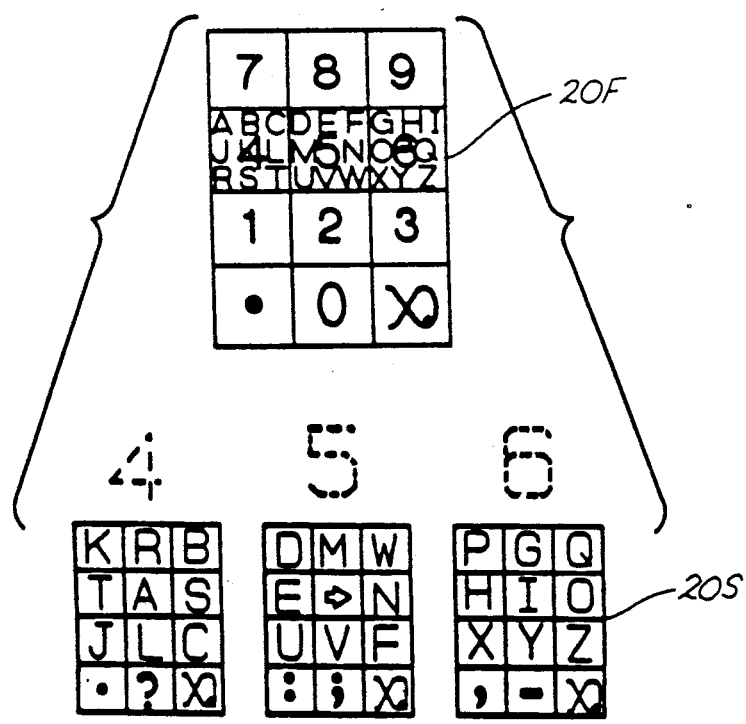
FIG. 5 is a layout of related keystroke instruction indicia for the two keystrokes necessary for entering all the alphabetic characters starting from a three key subset with the first keystroke.

While FIG. 4 shows both strokes of a two-stroke per entry alphabetic character entry mode and may be put on the display screen in response to the entry into the alpha mode, without a change of instruction indicia for every stroke, FIG. 5 illustrates an embodiment wherein the indicia changes for the first and second strokes in the alpha mode. Thus, the first stroke display 20F indicates the decimal single stroke per entry choices and the alphabetic first keystroke choices. Depending upon the first stroke choice of 4, 5 or 6, the corresponding active second stroke menu 20S will be displayed to show the position on the keyboard for the second stroke selection from the multiple-choice menu displayed. Other variations of keystrokes and menus may be provided without departing from the spirit or scope of the invention.

Figure 6:
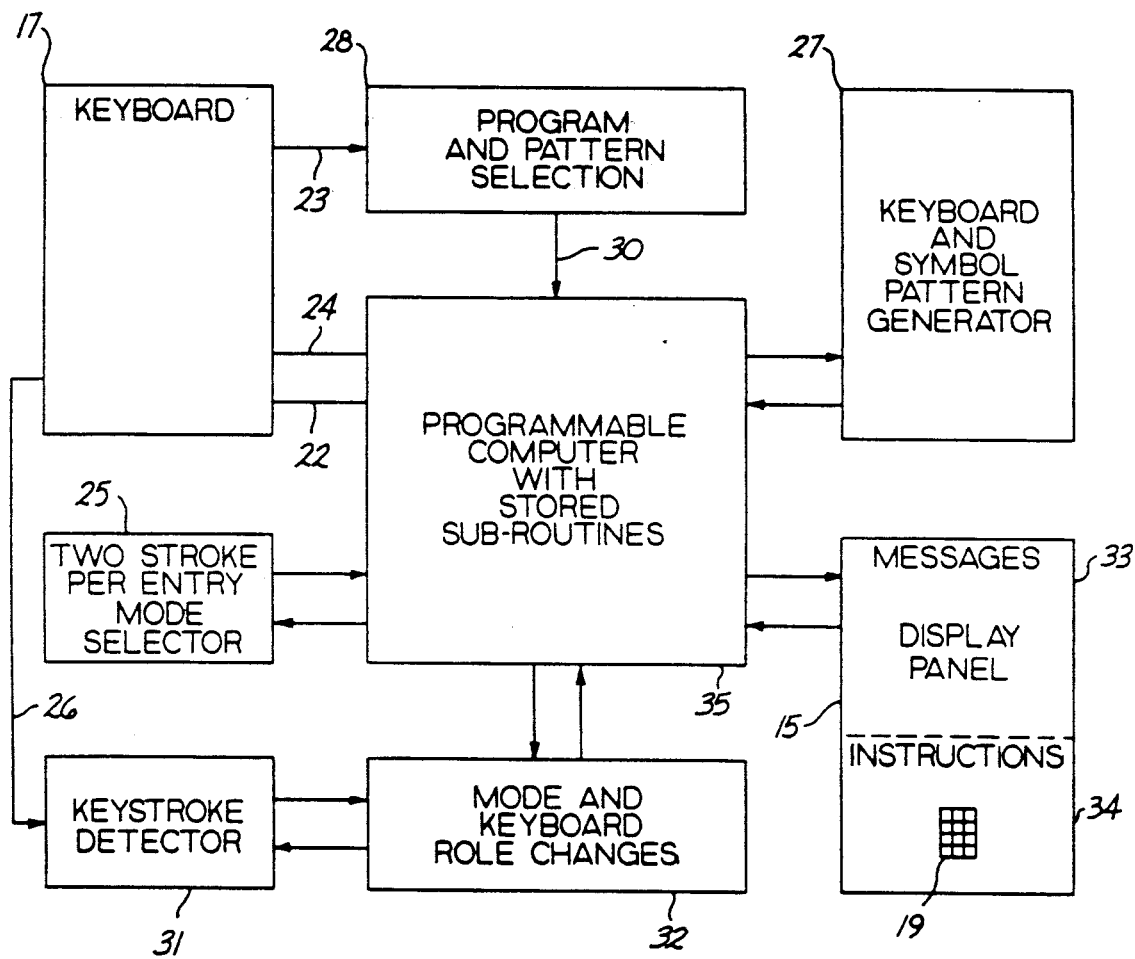
FIG. 6 is a block computer diagram showing the interrelationships of the keyboard and computer in organizing and processing dynamic keystroke instruction indicia.

In the computer system of FIG. 6 the computer 35 has built in programs and subroutines for choosing the default calculating mode, the one and two stroke per entry modes, the various commands and programs available, and the pattern generation functions afforded by this invention. The keyboard 17 by way of lead 22 has its role changed by the computer in different modes of operation, such as for example, one or two strokes per entry and different keystroke functions for the first and second keystrokes. The keyboard 17 may include cooperating or independent instruction indicia for operation of the keys, and preferably has such instructions for a default mode of computer operation such as a single stroke calculating mode where decimal digit keys input data with a single keystroke. The keyboard selects computer programs and instruction patterns by way of lead 23 with the program and pattern selector means 28. The usual data character and command input instructions to the computer are illustrated by lead 24.

The computer 35 has a default mode as explained which is a one stroke per entry calculating mode. By keyboard selection that mode may be changed, for example to an alpha two stroke per entry mode by way of mode selector means 25 in response to manual input from the keyboard 17, or automatic processing by computer 35 in response to a programmed subroutine. The pattern generator 27 in response to computer instructions and timing provides patterns such as symbols, characters and keyboard role charts.

The multi-line capability display panel 15 is divided into a message region 33 and an instruction region 34 on which a keyboard operation chart 19 may be displayed for example. When the computer is in an instruction mode for illustrating the choices for the next keystroke on the display screen 15, the region 34 is dedicated to the instructions, and region 33 retains its capacity to display data organized by the computer. In the operating modes of the computer such as word processing, the instruction mode may be toggled off so that the entire multi-line screen capacity is dedicated to the display of data. Suitable memory is available in the computer 35 or its system components shown herein for storing patterns for display upon demand from any program subroutine encountered requiring a particular pattern, such as a decimal digit, an alpha character, or a keyboard instruction chart.

In this system the keystroke instructions in panel region 34 are displayed automatically by computer programming for current keystroke choices available in the manner hereinbefore described. Thus, for example, the keystroke detector 31 may actuate the mode selection means 32 to establish a different keyboard role and if necessary an accompanying computer operating mode change. In the two stroke per entry mode therefore the stroke detector 31 would change the multichoice menu 19 on the keystroke instruction region 34 of the display panel to show the choices available for the next stroke in a keyboard simulation chart of the nature described.

It is implicit in this operating system as clear from the foregoing disclosure that few keys are required on the keyboard 17, typically twelve or sixteen, for entering alpha and numeric data and a large range of commands and operating modes. This is in part due to the two stroke per entry mode means 25 and in part due to the mode selection means 32 and elsewhere in computer subroutines, etc. that change the keyboard and keystroke role to provide a variety of selections from the same keys. For example with twelve keys there would be 144 selections in the two stroke per entry mode, and with changes in key roles or assignments this number of choices may be multiplied.

It is now clear that in accordance with this invention the art has been advanced by making a compact hand held computer operable in the field without reference to an instruction manual with keystroke instructions including key choices and sequences of selection formulated and displayed on the temporary display panel from computer organized patterns and timing automatically in real time as needed for different computer modes and keyboard assignments. In particular the complexities of keychoice and assignment for producing alphameric operation from very few keys in a multiple stroke per entry mode are made certain on the temporary display panel to avoid mistakes caused by uncertain memory or lack of access to an instruction manual.

The further embodiment of FIG. 7 has the feature of using only six keys 40 for the selection of all the alphabetic characters of a thirty-six choice set, including punctuation and space commands, etc. Also the operation in RPN is indicated by the triangular legend for the decimal point key 14'. In operation therefore, consider the choices available from the individual decimal 3 key 41 as exemplary. To start the word "GIN" then, a first stroke of the two stroke alpha sequence, as indicated on the keyface is necessary for a "G".

The notation on the keyface 41 is a geographic layout of the second stroke selection, which can be displayed automatically on the screen face as hereinbefore described, either with all sixteen keys shown, or in the alpha mode with only the necessary six key grouping 40 shown. From the geographic representation on the keyface 41, to select the alpha character "G" it is seen that the decimal "1" key 42 would be the second key selected in the two stroke alpha selection sequence. Accordingly any of the thirty-six selections shown on the keyfaces of the six key group 40 may be selected from the six keys only, without using any of the other ten keys. Note also the four keys with blank faces 43, etc., which can be programmed for a set of functions desired by a particular user, such as a set of Greek symbols. The number of selections available in the two stroke mode, concurrently with the alpha mode using the bank of six keys 40, would be a maximum of four times ten or forty selections from the two stroke sequences available. With a bit more complex programming four times sixteen or sixty-four selections could be made available by means of a mode selection of the second stroke of the bank of six keys 40 as shown on the faces only in response to the first stroke selection from that bank, in the same manner that the keyboard instructions for the second stroke are selected in response to a first stroke.

Figure 8:
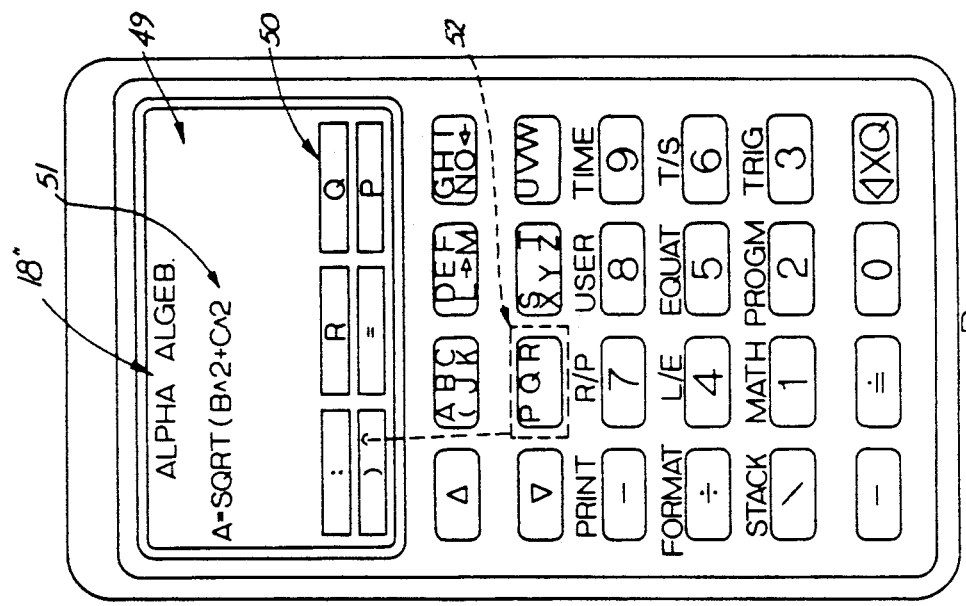
FIG. 8 shows an embodiment of the invention providing a hybrid keystroke operation of single and two strokes per entry so that decimal digits may be entered with a single stroke when mixed in with alpha characters requiring two-strokes-per-entry, wherein the alpha character selection keystroke sequence is illustrated on successive panels and a selection chart.

Now with reference to FIG. 8, this general alpha mode of operation with only six keys in the two stroke per entry mode can be supplemented by ten keys operable in the single stroke per entry mode for facilitating entry of numeric data characters, as for example used for algebra or computer programming steps. Note the combined (default) mode annunciator 18" signifying a dual alpha-algebraic mode or simply alphanumeric. Eighteen keys are used for the alphameric character entries, and six function keys are provided for quick access to the conventional arithmetic functions, and other desired functions such as up and down line shift arrows for use in moving a cursor or position marker for the next entry in a multiple line display as afforded herein.

The alpha mode selection here, as also in FIG. 7, provides for the visual display on the temporary computer generated display panel 49 of instructions for a current keystroke entry choice by means of menu 50. Thus to complete the formula 51 with a ")", the first keystroke selection 52 in the two-stroke sequence brings up the menu 50 automatically to show the role of the keys for the second stroke. The six-key layout therefore indicates that the desired symbol is selected by a further stroke of the same key 52 from the six key set of alpha mode keys. Note that the keystroke selections are not necessarily in the format shown on the keyface, since it is preferable to have key layouts that expedite entries more often encountered.

This should be evident from FIG. 8C which charts the various second stroke selections available from the six "alpha" keys. Note that the display is automatically removed as soon as the second key is stroked. Also note those selections marked with an * to indicate that these frequently encountered symbols are entered by two strokes of the same key.

Figure 9:
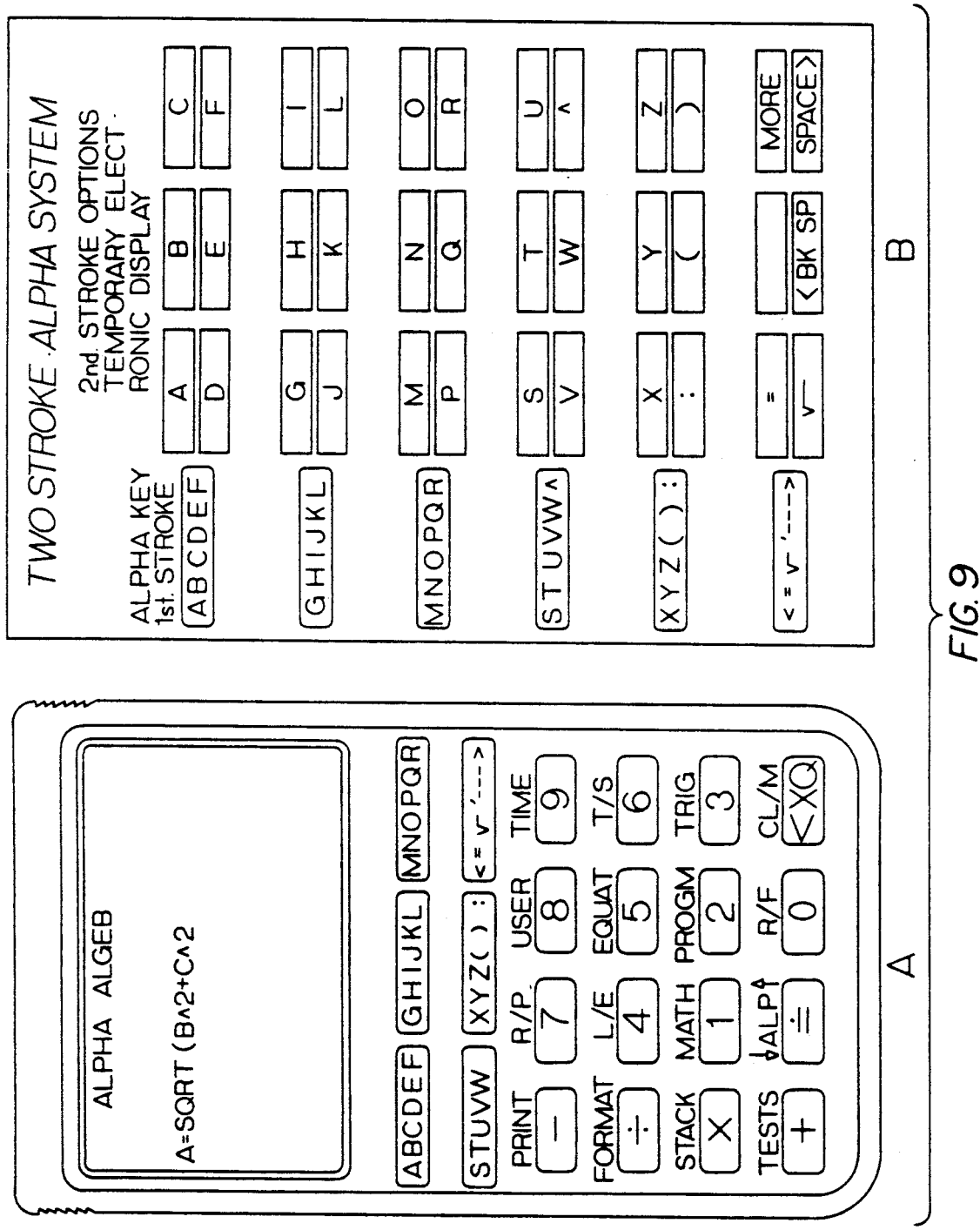
FIG. 9 shows a further similar embodiment with alternative alpha character layout on a set of only six keys.

A further keyboard layout option for the alphabetic entries is shown in FIG. 9. In this embodiment the six alpha keys are located just below the temporary display and are geographically related to the temporary display menu layout as shown in FIG. 9B. The layout is more closely related to an alphabetic sequence, and this may be desirable for locating the first keystroke easily. The key size and shape together with the few required keys permits ample finger room that errors are not induced by hitting the wrong or dual keys, and a layout that can readily be learned for one handed touch typing.

Having therefore advanced the state of the art, those novel features of the invention defining the advance in the art are set forth with particularity in the following claims.

I claim:

1. A manual keyboard actuated multi-function alphanumeric computer system having a computer operating system responsive to a wide system range of hundreds of data and function entries from the keyboard housed in a housing and comprising in combination, said alphanumeric computer system having both a keyboard and visible display screen housed in the computer housing, means storing a set of subroutines in said computer operating system for selection to operate the computer as constituents of data processing programs for processing said data and function entries computer data processing means responsive to computer instruction commands and said stored subroutines in said data processing programs for processing alphanumeric data and for organizing and displaying alphanumeric characters upon said display screen for the functions provided by said computer system said keyboard having a set of manually operable keys in said keyboard operatively coupled to process alphanumeric data in said computer including a decimal entry subset of ten keys operable to enter numerical digits into said computer, means for providing the keyboard with a subset of data entry keys in said set of keys, including said decimal entry subset, means for entering both a set of alphabetic characters from a predetermined alphabet set and a plurality of computer instruction commands one by one into the computer data processing means in response to selected keystrokes of keys in said subset of data entry keys in a two-stroke per entry code, computer mode changing means for changing computer operating modes in response to selected keys in said subset of data entry keys to establish different modes wherein selected ones of the keyboard keys have different roles for entering in one mode said alphabetic characters and in another mode computer instruction commands into said computer, computer activated means for processing in response to said stored subroutines alpha characters and decimal digits for entry from respective said subsets of decimal entry and data entry keys in a data character entry mode established by said computer mode changing means, and visual data entry instruction means operated automatically by said stored subroutines in said computer for setting aside temporarily on a predetermined instruction region of the display screen separated from a data display region different sets of keyboard operating instructions specifying the operating function of a plurality of individual said data entry keys in said subset of data entry keys in a plurality of currently selected ones of said operation modes for making a designated set of said computer entries responsive to keystrokes of particular keys in said set of keys and for retaining a separate data region of the display screen operating automatically from said stored subroutines in said computer for currently displaying alpha data characters as they are entered from said data entry keys for processing in the computer, whereby selected alpha data characters may be entered one by one into the computer as identified by the display of said keyboard operating instructions for entering the selected characters upon the display screen in response to two keystrokes per alpha character of keyboard keys in said data entry subset of keys.

2. The system of claim 1 further comprising, means for operating the computer in a two stroke per entry mode for entry of alphabetic characters from a subset of six of the keys in said set, wherein said visual data entry instruction means is operable to display said keyboard operating instructions responsive to the entry of a first of two strokes for an alphabetic character entry for displaying on said screen instruction region of a menu of alphabetic character options available for entry with the second of said two strokes.

3. The system of claim 1 further comprising, means positioning said subset of data entry keys in a pattern on said keyboard, identifying indicia for the respective keys in said data entry subset of keys, and means in said visual data entry instruction means for organizing said keyboard operating instructions for the data entry subset of keys on the data region of the display screen in a geographic pattern related to said data entry key pattern to identify the location of specific keys to be stroked for specified keyboard entries.

4. The system of claim 1 wherein the set of keys include corresponding manually actuated keyswitches and the visual data entry instruction means further comprise, two-stroke-per-entry means for operating the computer from a subset of six data entry keys in at least one data entry mode that requires a sequence of a fixed number of exactly two sequential keystrokes from the keyswitches for entry of any selected alphabetic character in said predetermined alphabet set, and wherein said visual data entry instruction means further comprises means responsive to at least one of said two sequential keystrokes to provide a menu on said instruction region of the display screen indicating a multiple-choice selection of the two keystrokes for entering those alphabet characters of said set.

5. The system of claim 1 further comprising, two-stroke-per-entry means in said computer mode changing means for providing a keyboard role requiring a two manual stroke sequence of keys in six keys of said subset of data entry keys for entry of selected alphabetic characters from said predetermined alphabet set, and wherein the visual data entry instruction means further comprises means for indicating on the display screen instruction region indicia identifying the two keyboard keys in said data entry subset to be chosen and the sequence of actuation thereof for the two-stroke-per-entry selection of each alphabetic character.

6. The system of claim 5 wherein said visual data entry instruction means further comprises menu patterning means for displaying separate key selection instruction patterns on said screen for each of the two keystrokes in said two-stroke-per-entry sequence, the pattern for each step providing a multiple choice menu indicating the keystroke choices for the selection of specific keys in the data entry key subset and corresponding alphabetic characters for each of the patterns.

7. The system of claim 1 wherein the computer system comprises computer operable means for producing on said data display region of the screen a multi-line visible alphanumeric display pattern on said screen, and structure locating said screen and keyboard on a common panel of said housing.

8. The system of claim 1 wherein the keyboard comprises a plurality of manually operable keyswitches, and the computer mode changing means further comprises means responsive to manually entered keyswitch strokes from said subset of data entry keys for the entry of instructions for establishing different computer operating modes including an alpha character data entry mode, whereby the computer in said alpha character data entry mode, enters, processes, and displays alphabetic characters from said predetermined alphabet set.

9. A system as defined in claim 1 wherein said visual data entry instruction means further comprises means for generating an operating instruction display on said instruction region of the display screen in the form of a layout pattern menu representing location of at least one subset of the keyboard keys accompanied by indicia identifying the role of different displayed keys activated in a current operating mode of the computer in effect by means of said computer mode changing means.

10. The system defined in claim 9, wherein said means for generating an operating instruction display comprises means providing said operating instruction for each of said two keystrokes in the two-stroke-per-entry alpha mode for entering a specific alpha character in a form of at least one display chart identifying the keys to stroke for selection of specific alphabetic characters in said predetermined set from said data entry subset of keys.

11. The system defined in claim 10 wherein said means for providing operating instructions in the form of at least one chart further comprises display forming means for producing different chart displays on said screen synchronized with the two key strokes required per entry for indicating the current keystroke selections for selection of the alphabetic characters in said predetermined set in effect for each of the two keystrokes.

12. The system defined in claim 11 wherein said means for producing different chart displays for indicating keystroke selections for each of the two keystrokes further comprises, display generating means for producing a chart synchronized with the first of two successive keystrokes for selection of an alphabet character having a menu display on said screen additionally indicating the selections available with the second keystroke.

13. The system defined in claim 1 wherein said computer system further comprises, means for setting the computer into a default mode for processing arithmetic calculations wherein the decimal entry subset of ten keys has the role of producing a computer entry, including decimal numerical digits 0 to 9 in response to a single stroke of a corresponding one of the keys per entry, and means for entering alphabetic characters in response to keystrokes from said data entry subset of keys in a data entry mode in which entries of specific alphabetic characters in said predetermined alphabet set are entered in response to keystrokes from said data entry subset of keys in a data entry mode in which entries of specific alphabetic characters in said predetermined alphabet set are entered in response to two successive keystrokes per entry.

14. The system in claim 13 wherein said visual data entry instruction means further comprises means for generating a display in said screen instruction region including instructions for selection of a key for the first of said two keystrokes for selection of any one of the alphabetic characters in said set, and for generating in response to a second of said two keystrokes a further instruction display in said screen instruction region for identifying selection of a second stroke for identifying a single alphabet character in said set.

15. The system of claim 14 wherein said means for generating a display further comprises means for displaying said instructions in the form of a chart representing a layout array of said data entry subset of keys for each of the two keystrokes for selection of a specific alphabetic character.

16. In a hand held multi-function alphanumeric computer with the capability of processing hundreds of data characters and alphanumeric command functions mounted in a housing having a common panel with a manual entry keyboard and a temporary display panel for displaying computer processed data indicia, the improvement comprising, means operable with said display panel to display alphanumeric data thereon in a plurality of lines of alpha characters, a limited number of keyboard keys divided into two mutually exclusive subsets of keys for entry respectively of decimal digits and alphabet characters, computer control means operable by the keyboard keys for selecting and automatically entering when selected a variety of computer input instructions and data input characters including a set of alphabetic characters in a two stroke per entry mode from said alphabet character subset of keys, computer operating means for controlling the keyboard and computer system means responding to keyboard keystroke entries to respond simultaneously to two keyboard input modes of operation, namely single stroke per entry for ten decimal digits from said subset of keys for decimal digits, and two stroke per entry for a set of alphabetic characters from said subset of keys for alphabet characters and computer data organization means for organizing and displaying on said temporary display panel in two mutually exclusive regions of the panel respectively (1) keystroke selection instructions in the multiple stroke per entry mode in the form of a multiple-choice chart identifying the functional response of individual keys in said alphabet character subset of keys on the keyboard to enter alphabetic characters in said set and (2) multiple line alphanumeric data messages processed by the computer in response to actuation of the keyboard keys.

17. In a hand held alphanumeric computer having a computer operated temporary display panel operable from a manually operated keyboard having a set of at least sixteen keys divided into two mutually exclusive subsets of six alphabet input keys and ten decimal input keys, the improved combination comprising, computer means for presenting a multiple line alphanumeric display screen on said panel divided into two mutually exclusive regions for display respectively of instructions and computer processed messages, computer means operating the computer in two entry modes respectively requiring a single stroke per entry from said decimal input keys for entry of decimal digits and two successive strokes per entry for entry of alphabetic characters from said six alphabet input keys, and means for operation of a further subset of keys on the keyboard for entry of computer instructions in the one-stroke-per-entry mode.

18. The combination defined in claim 17 further comprising mode changing means in said computer including means for changing the roles of at least the six alpha input keys in different operating modes with a corresponding generation of operation instruction changes in said instruction display region.

* * * * *